(12) United States Patent
Rasheed et al.

(10) Patent No.: US 9,472,443 B2
(45) Date of Patent: Oct. 18, 2016

(54) SELECTIVELY GROUNDABLE COVER RING FOR SUBSTRATE PROCESS CHAMBERS

(71) Applicant: APPLIED MATERIALS, INC., Santa Clara, CA (US)

(72) Inventors: Muhammad M. Rasheed, San Jose, CA (US); Kirankumar Savandaiah, Bangalore (IN); William Johanson, Gilroy, CA (US); Zhenbin Ge, San Jose, CA (US); Goichi Yoshidome, Emeryville, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 686 days.

(21) Appl. No.: 13/831,363

(22) Filed: Mar. 14, 2013

(65) Prior Publication Data

US 2014/0262763 A1 Sep. 18, 2014

(51) Int. Cl.
 *C23C 14/34* (2006.01)
 *H01L 21/687* (2006.01)
 *H01J 37/32* (2006.01)
 *C23C 14/50* (2006.01)

(52) U.S. Cl.
 CPC ......... *H01L 21/68735* (2013.01); *C23C 14/34* (2013.01); *C23C 14/50* (2013.01); *H01J 37/32651* (2013.01); *H01J 37/32715* (2013.01)

(58) Field of Classification Search
 CPC .............. C23C 14/50; H01J 37/32651; H01J 37/32715
 See application file for complete search history.

(56) References Cited

U.S. PATENT DOCUMENTS

| | | | |
|---|---|---|---|
| 7,981,262 B2 * | 7/2011 | Pavloff ............ | H01J 37/32477 118/720 |
| 2007/0116872 A1 * | 5/2007 | Li ........................... | C23C 16/12 427/248.1 |
| 2010/0218785 A1 * | 9/2010 | Green ..................... | C23C 14/50 134/1.1 |
| 2011/0278165 A1 * | 11/2011 | Rasheed ................. | C23C 14/35 204/298.11 |

OTHER PUBLICATIONS

U.S. Appl. No. 13/831,424, filed Mar. 14, 2013, Ge et al.

* cited by examiner

*Primary Examiner* — Jason M Berman
(74) *Attorney, Agent, or Firm* — Moser Taboada; Alan Taboada

(57) ABSTRACT

Embodiments of a process kit for substrate process chambers are provided herein. In some embodiments, a process kit for a substrate process chamber may include a ring having a body and a lip extending radially inward from the body, wherein the body has a first annular channel formed in a bottom of the body; an annular conductive shield having a lower inwardly extending ledge that terminates in an upwardly extending portion configured to interface with the first annular channel of the ring; and a conductive member electrically coupling the ring to the conductive shield when the ring is disposed on the conductive shield.

19 Claims, 8 Drawing Sheets

SELECTIVELY GROUNDABLE COVER RING FOR SUBSTRATE PROCESS CHAMBERS

FIELD

Embodiments of the present invention generally relate to a semiconductor processing.

BACKGROUND

Some substrate process chambers utilize a process kit that includes a cover ring disposed above a dielectric deposition ring. The cover ring includes a central opening through which an exposed substrate is processed. The inventors have observed that the grounding condition (e.g., electrically grounded or floating) of the cover ring may influence a processing profile of the substrate proximate an edge of the substrate. For example, the cover ring may be grounded via physical contact of the ring to a grounded chamber component (e.g., a shield) during some processes to facilitate process uniformity at the edge of the substrate. However, the inventors have discovered that for processes utilizing power provided in a VHF range (e.g., greater than about 30 MHz), the existing physical contact between the ring and process chamber components is not sufficient to electrically ground the ring, resulting in an increase in electrical potential of the ring, and thus, process non-uniformities across the substrate.

Therefore, the inventors have providing an improved process kit for substrate process chambers.

SUMMARY

Embodiments of a process kit for substrate process chambers are provided herein. In some embodiments, a process kit for a substrate process chamber may include a ring having a body and a lip extending radially inward from the body, wherein the body has a first annular channel formed in a bottom of the body; an annular conductive shield having a lower inwardly extending ledge that terminates in an upwardly extending portion configured to interface with the first annular channel of the ring; and a conductive member electrically coupling the ring to the conductive shield when the ring is disposed on the conductive shield.

In some embodiments, process chamber includes a substrate support disposed within a inner volume of the process chamber, the substrate support having a deposition ring disposed atop the substrate support and a conductive housing disposed about the substrate support; a process kit disposed about a peripheral edge of the substrate support, wherein at least a portion of the process kit is disposed above a substrate supporting surface of the substrate support, and wherein the process kit includes: a ring having a body and a lip extending radially inward from the body, the lip partially overlapping a portion of the deposition ring, wherein the body has a first annular channel formed in a bottom of the body; an annular conductive shield having a lower inwardly extending ledge that terminates in an upwardly extending portion configured to interface with the first channel of the ring; and a conductive member electrically coupling the ring to the conductive shield when the ring is disposed on the conductive shield.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
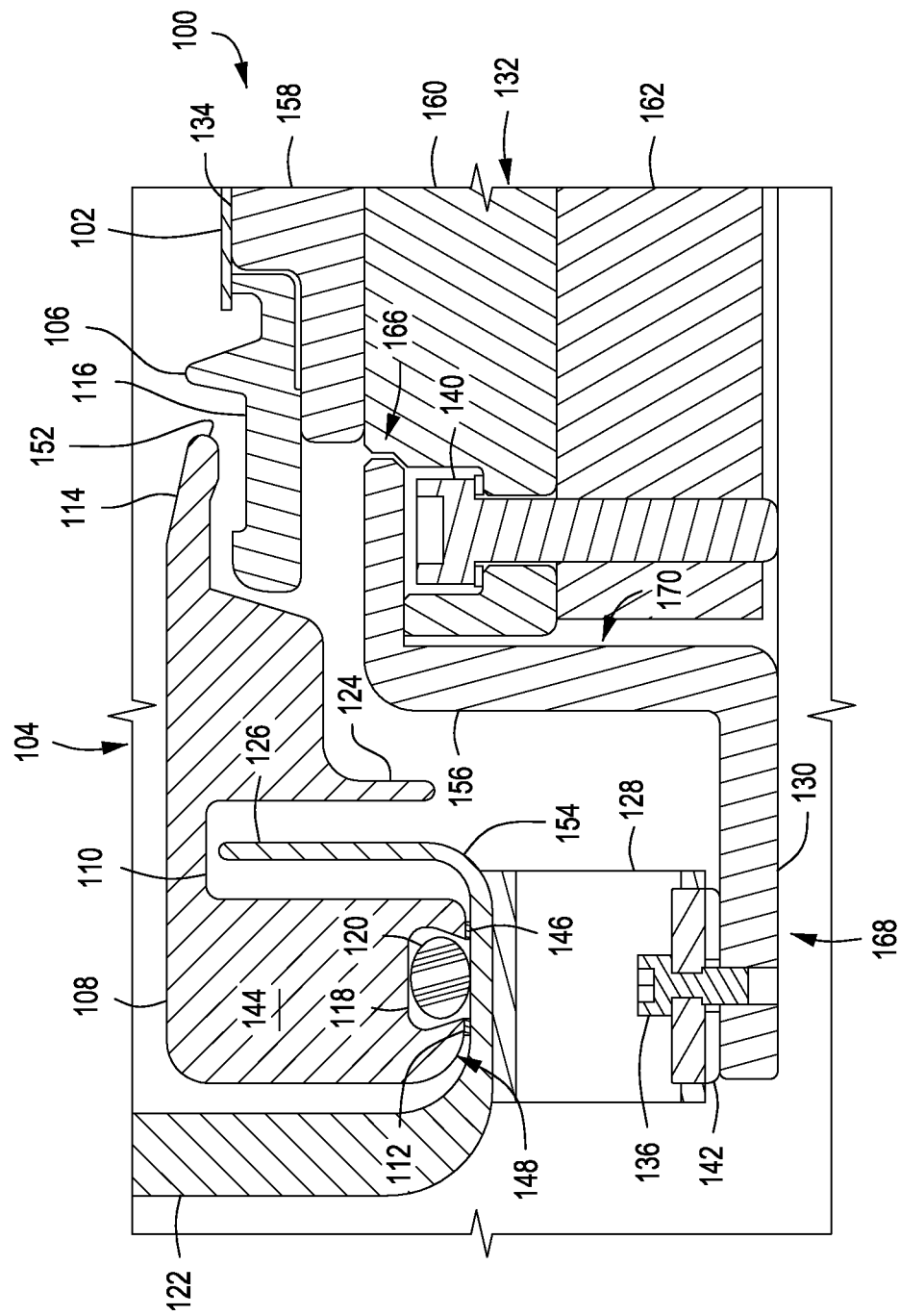
FIG. 1 depicts a portion of a process kit for a substrate process chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of selectively groundable cover rings for substrate process chambers are provided herein. In at least some embodiments, the inventive cover ring may facilitate a selective grounding of the cover ring to accommodate for the requirements of a desired process. In addition, when grounded, the inventive cover ring may provide a more robust electrical coupling of the cover ring to conductive process chamber components as compared to conventional process kits. Moreover, embodiments of the inventive cover ring may provide an electrical coupling (and therefore, grounding) during processes utilizing a high frequency power source (e.g., greater than about 30 MHz) that would otherwise not be obtainable by conventional grounding techniques.

FIG. 1 depicts a process kit for a substrate process chamber in accordance with some embodiments of the present invention. In some embodiments, the process kit 104 may generally include a ring 108 (e.g., a cover ring) and a conductive member 120 to electrically couple the ring 108 to a conductive shield 122. In some embodiments, the process kit 104 and conductive shield 122 are generally disposed about a substrate support 100.

In some embodiments, the substrate support 100 may generally comprise a body 132 having a plurality of layers (three layers 158, 160, 162 shown) and a substrate supporting surface 134 to support a substrate 102. In some embodiments, two or more of the plurality of layers may be coupled together via a fastener 140. In some embodiments, a deposition ring 106 may be disposed atop the body 132 and about a peripheral edge of the substrate supporting surface 134. When present, the deposition ring 106 may protect underlying portions of the substrate support 100 during processing.

In some embodiments, one or more of the plurality of layers may be configured to facilitate performing a desired process in the process chamber. For example, in some embodiments, a first layer 158 may be fabricated from a dielectric material and have an electrode embedded therein to provide chucking power to facilitate securing the substrate 202 on the substrate support surface 226 (e.g., an electrostatic chuck). The dielectric material may be any process compatible dielectric material, for example, a ceramic such as aluminum oxide ($Al_2O_3$), silicon nitride (SiN), or the like. Additional layers (e.g., the second layer 160 and third layer 162) may include one or more conductive layers disposed below the first layer 158 configured to, for example, be part of an RF electrode, or the like which may be used to provide RF energy to the substrate support 100. Alternatively, or in combination, in some embodiments, cooling channels (not shown) may be disposed within one or more of the plurality of layers and configured to flow a coolant to control a temperature of the substrate support and/or substrate.

In some embodiments, the substrate support 100 may comprise a housing 130 disposed about the body 132 of the substrate support 100. When present, the housing 130 covers at least a portion of the substrate support 100 to protect the substrate support 100 during processing. In some embodiments, the housing 130 may comprise a first end 166 configured to rest upon a portion of substrate support 100, a second end 168 extending radially outward from the first end 166 and a center portion 170 coupling the first end 166 to the second end 168. The housing 130 may be fabricated from any process compatible conductive material suitable for use in a process chamber (e.g., the process chamber discussed below with respect to FIG. 3), for example, a metal, such as aluminum, an aluminum alloy, stainless steel, titanium, or the like.

The conductive shield 122 surrounds the process kit 104 and extends upwards along the walls of the process chamber (e.g., as described below with respect to FIG. 8). In some embodiments, the conductive shield 122 may be annularly shaped, having a lower inwardly extending ledge 154 that terminates in an upwardly extending portion 126. In such embodiments, the conductive shield 122 may be disposed in the process chamber such that the conductive shield 122 surrounds at least a portion of the substrate support 100, for example as shown in FIG. 1. In some embodiments, the conductive shield 122 may be grounded via, for example, an electrical coupling of a portion of the conductive shield 122 to a grounded component of the process chamber (e.g., the chamber body). The conductive shield 122 may be fabricated from any process compatible conductive material suitable for use in the process chamber, for example, a metal, such as aluminum, an aluminum alloy, stainless steel, titanium, or the like.

In some embodiments, the conductive shield 122 may be electrically coupled to the housing 130, thus grounding the housing 130 when the conductive shield 122 is coupled to a grounded portion of the process chamber, such as described above. In such embodiments, the conductive shield 122 may be electrically coupled to the housing 130 via a first grounding strap 128. The first grounding strap 128 may comprise any type of grounding strap suitable to electrically couple the conductive shield 122 to the housing 130, for example such as a strip of material, a braided material, a ring of material, or the like. The first grounding strap 128 may be fabricated from any process compatible conductive material, for example such as aluminum. In some embodiment, the conductive material may be flexible to facilitate continuous coupling of the conductive shield 122 to the housing 130 during movement of the substrate support 100. In some embodiments, one or more fasteners (one fastener 136 shown) and/or washers 142 may facilitate coupling the grounding strap 128 to the housing 130.

The ring 108 generally comprises a body 144 and a lip 114 extending radially inward from the body 144. The ring 108 may be fabricated from any process compatible conductive material suitable for use in a process chamber, for example, a metal, such as aluminum, an aluminum alloy, stainless steel, titanium, or the like.

In some embodiments, the body 144 of the ring 108 may include one or more features configured to interface with components of the process chamber, such as the conductive shield 122, a substrate support 100, or the like. For example, in some embodiments, a first annular channel 110 may be formed in a bottom 148 of the body 144 to interface with an end (upwardly extending portion 126) of the inwardly extending ledge 154 of the conductive shield 122. Alternatively, or in combination, in some embodiments, the body 144 may have a downwardly extending ring 124 extending from the bottom 148 of the body 144 and configured to interface with an outer surface 156 of the housing 130 of the substrate support 100. When present, the above described features (e.g., the first annular channel 110 and/or the extension 124) may facilitate precise placement of the ring 108 as the ring 108 is moved during, before, or after a process is performed.

The conductive member 120 electrically couples the ring 108 to the conductive shield 102 when the ring 108 is disposed on the conductive shield 102, such as shown in FIG. 1. The inventors have observed that providing the conductive member 120 provides a more robust electrical coupling (and thus grounding of the ring 108 via the conductive shield 102) as compared to, for example, just contacting portions of the bottom 144 of the ring 108 to the conductive shield 122. In addition, the inventors have observed that the conductive member 120 may provide an electrical coupling during processes utilizing a high frequency power source (e.g., greater than about 30 MHz) that would otherwise not be obtainable by contacting portions of the bottom 144 of the ring 108 to the conductive shield 122.

The conductive member 120 may have any size or shape suitable to provide the above described electrical coupling of the conductive shield 102 and the ring 108. For example, in some embodiments, the conductive member 120 may be a gasket, a tubular or solid ring, or in some embodiments, a canted coil spring. The conductive member 120 may be fabricated from any process compatible conductive materials, for example, a metal such as aluminum, an aluminum alloy, stainless steel, beryllium copper, nickel, nickel plated copper, or the like.

In some embodiments, the conductive member 120 may be at least partially disposed within a second channel 118 formed in the bottom 148 of the body 144. The second channel 118 may be disposed in any position with respect to the body 144, for example, such as disposed radially outward of the first channel 110. In such embodiments, the conductive member 120 contacts the inwardly extending ledge 154 of the conductive shield 122.

In some embodiments, the body 144 may comprise a plurality of tabs (two tabs 112, 146 shown) extending from the bottom 148 of the body 144. When present, the plurality of tabs provide an increased surface area of contact between the body 144 and the conductive shield 122 to facilitate electrically coupling the body 144 to the conductive shield 122. The plurality of tabs may be disposed in any position suitable to provide the above described contact between the body 144 and the conductive shield. For example in some embodiments, the plurality of tabs may be disposed adjacent to the second channel 118, such as shown in FIG. 1. The one or tabs may comprise any size and shape suitable to provide the increase contact between the body 144 and the conductive shield 122. For example, in some embodiments, each of the one or more tabs may be rectangular, having a length of about 0.020 to about 0.250 inches, or in some embodiments, about 0.060 inches, a width of about 0.020 to about 0.250 inches, or in some embodiments, about 0.020 inches, and a thickness of about 0.005 to about 0.250 inches, or in some embodiments, about 0.020 inches. Although two tabs 112, 146 are shown, any number of tabs may be utilized to provide sufficient contact between the ring 108 and the conductive shield 122. For example in some embodiments, three sets of two tabs may be disposed adjacent to the channel 118 and symmetrically about the ring 108.

In some embodiments, the lip 114 may be configured to at least partially overlap with a portion of the deposition ring 106. Configuring the lip 114 to at least partially overlap the portion of the deposition ring 106 allows the lip 114 to interface with the deposition ring 106 as the deposition ring 106 is raised. In some embodiments, the lip 114 may have an end 152 configured to interface with a feature 150 formed in an upper surface 116 of the deposition ring 106.

Figure 2:
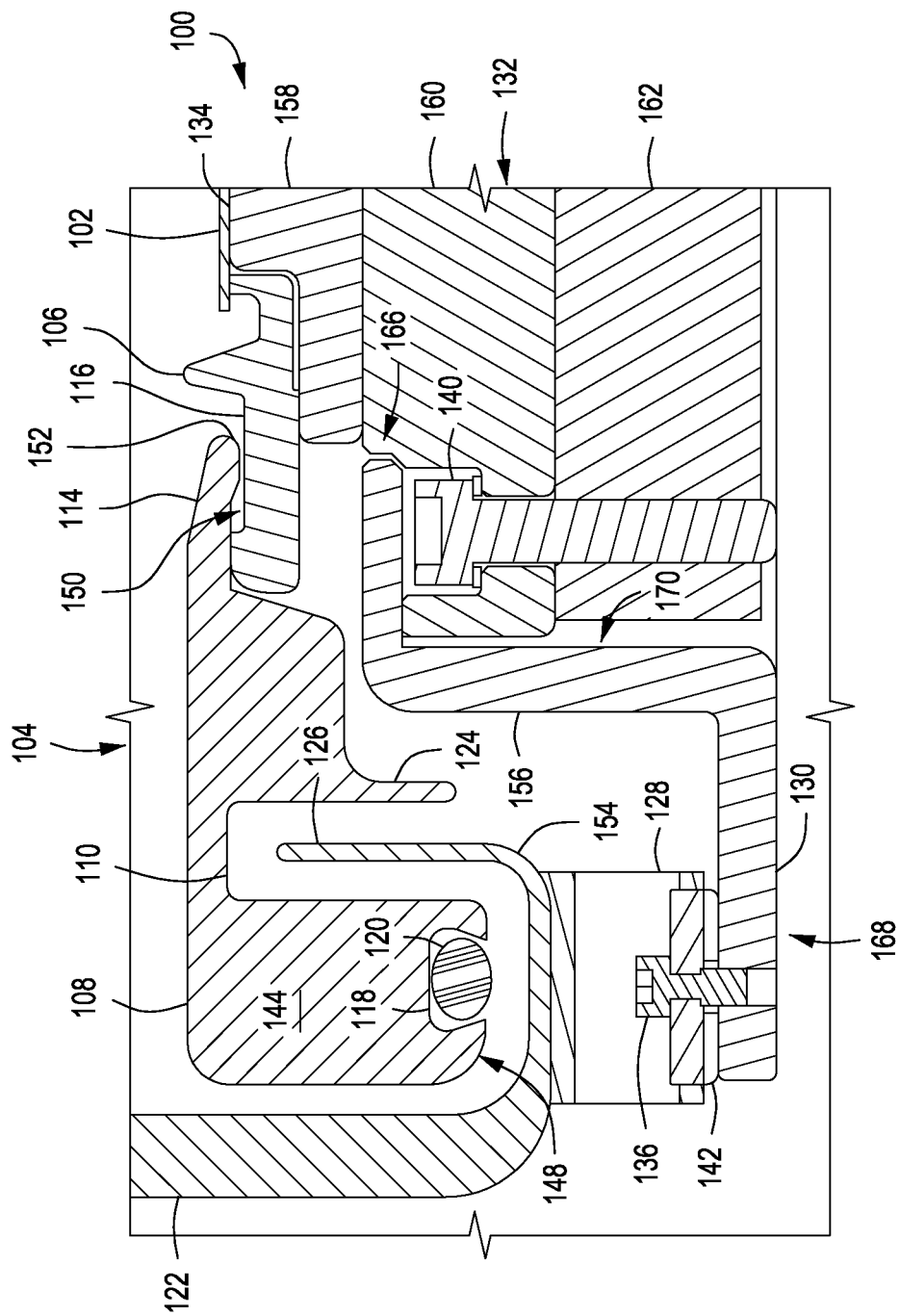
FIG. 2 depicts a portion of a process kit for a substrate process chamber in accordance with some embodiments of the present invention.

In operation, as the deposition ring 106 is raised (via raising the substrate support 100), the deposition ring 106 interfaces with the lip 114 and lifts the ring 108, for example, such as shown in FIG. 2. By lifting the ring 108, contact between the conductive member 120 and the ring 108 is broken, thereby eliminating the electrical coupling between the conductive shield 122 and the ring 108, thus causing the ring 108 to be electrically floating. As such, the ring 108 may be selectively grounded in accordance with a desired process performed in the process chamber by lifting the ring 108 and eliminating coupling between the conductive shield 122 and the ring 108 (as shown in FIG. 2) or lowering the ring to electrically couple the conductive shield 122 and the ring 108 (as shown in FIG. 1). For example, the inventors have observed that when performing an etch process the ring 108 may be grounded by lowering the substrate support 100 to allow the conductive member 120 to contact the conductive shield 122, thus electrically coupling the conductive shield 122 and the ring. Alternatively, the inventors have observed that when performing a deposition process, the ring 108 may be lifted to cause the ring 108 to be electrically floating, as described above.

Figure 3:
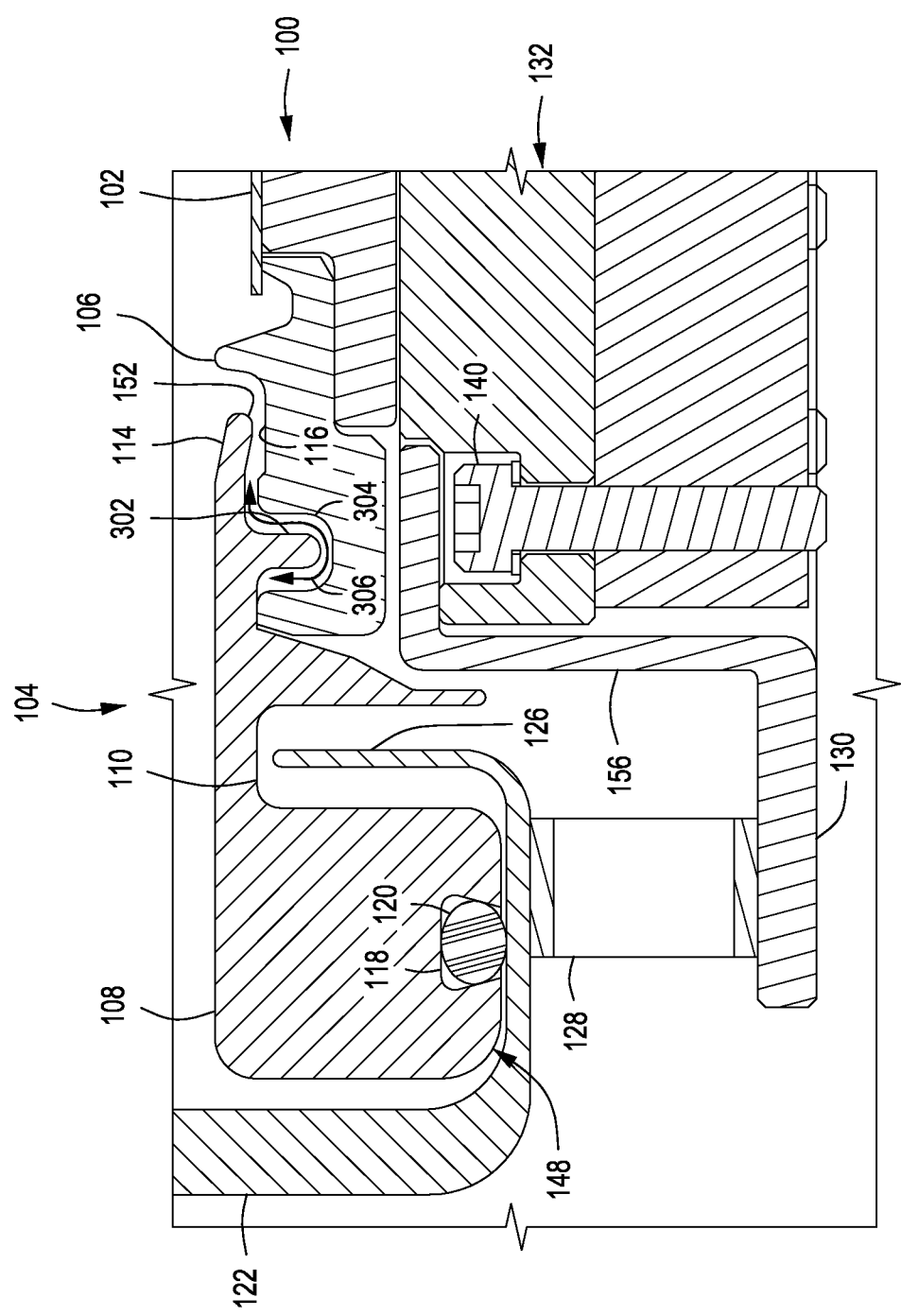
FIG. 3 depicts a portion of a process kit for a substrate process chamber in accordance with some embodiments of the present invention.

Referring to FIG. 3, in some embodiments, the lip 114 may comprise a downwardly extending protrusion 302 configured to interface with a channel 304 formed in the deposition ring 106. When present, the protrusion 302 and channel 304 provides a non-linear flow path (indicated by arrow 306) between the ring 108 and the deposition ring 106, thereby reducing or eliminating a flow of process gases and/or plasma from a processing area (e.g., an area proximate the substrate 102) to outside of the substrate support 100 (e.g., proximate the grounding strap 128, conductive shield 122, or the like)

Figure 4:
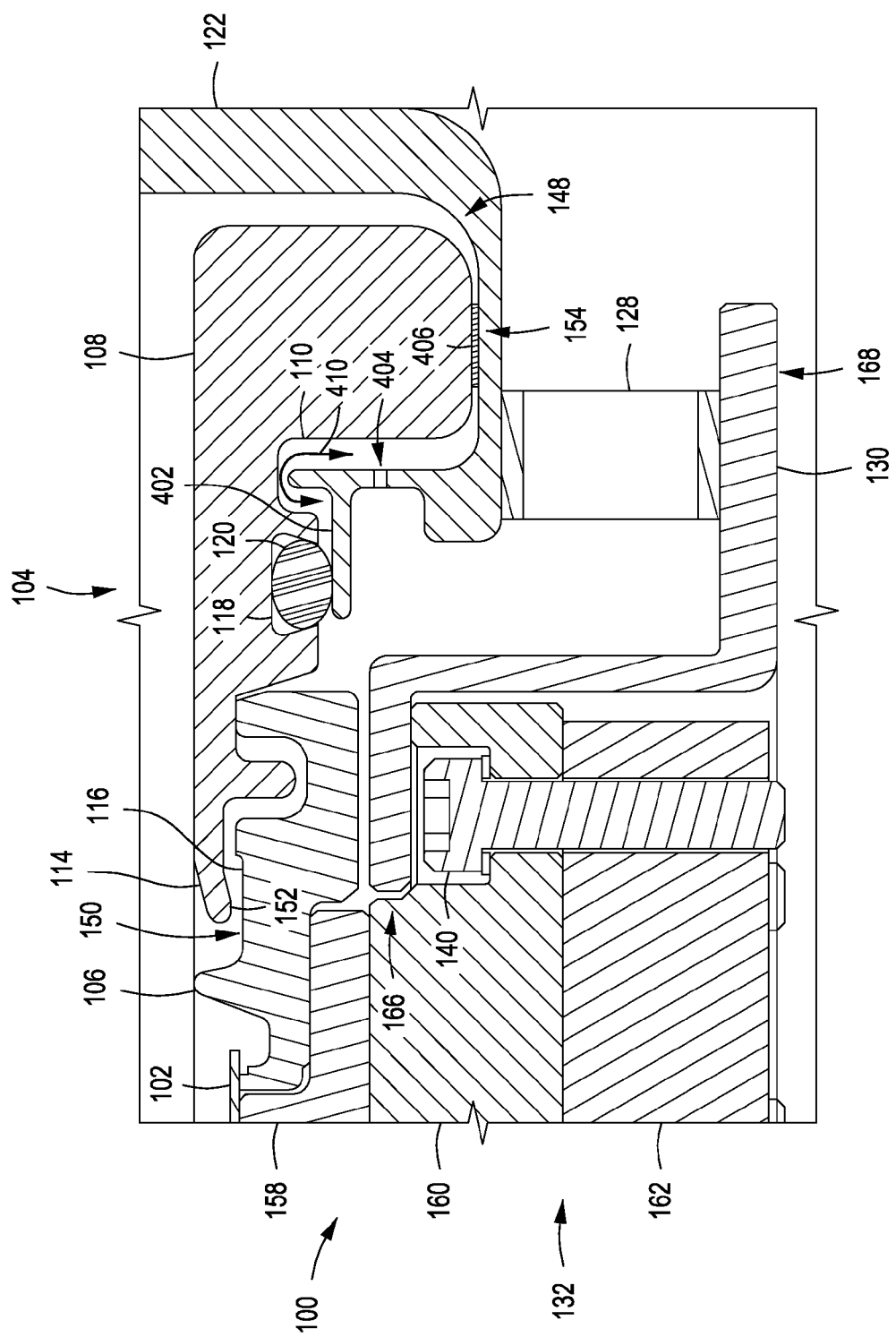
FIG. 4 depicts a portion of a process kit for a substrate process chamber in accordance with some embodiments of the present invention.

Although the conductive member 120 is shown in FIGS. 1-3 as positioned such that the conductive member 120 contacts the inwardly extending ledge 154 of the conductive shield 122, the conductive member 120 may be disposed in any position suitable to provide an adequate electrical coupling of the ring 108 and conductive shield 122 to provide the selective grounding of the ring 108 as described above. For example, referring to FIG. 4, in some embodiments, the second channel 118 and the conductive member 120 may be disposed radially inward of the first channel 110. In such embodiments, the conductive member 120 may contact an inwardly extending radial lip 402 disposed on an outer surface 508 of the inwardly extending ledge 154. In some embodiments, disposing the conductive member 120 radially inward of the first channel 110 and providing the inwardly extending radial lip 402 may provide a non-linear flow path (indicated by arrow 410) between the ring 108 and the deposition ring 106, thereby reducing or eliminating instances of particles that are formed from contact between the ring 108 and the conductive shield 122 from reaching the substrate 100. The flow paths in FIGS. 3 and 4 are bi-directional flows as indicated by 306 and 410, i.e., the gas flow may be in either direction depending on the process. For example, as indicated in FIG. 4, under some conditions, such as pressurizing the processing volume (848, FIG. 8) the gas flow would be left-to-right as drawn. Under different conditions, such as during pump down of the chamber, the gas flow would be right-to-left as illustrated in FIG. 4.

In some embodiments, a plurality of gas holes 404 may be formed in the conductive shield 122 to allow a flow of gas through the conductive shield 122 during processing. When present, the plurality of gas holes 404 may further reduce or eliminate instances of particles that are formed from contact between the ring 108 and the conductive shield 122 from reaching the substrate 100. The plurality of holes 404 may be disposed in any position about the conductive shield 122. For example, in some embodiments, the plurality of gas holes 404 may be disposed beneath the inwardly extending radial lip 402, such as shown in FIG. 4. In addition, each of the plurality of holes 404 may comprise any dimensions suitable to allow a desired amount of gas flow through the conductive shield 122. For example, in some embodiments, each of the plurality of holes 404 may have a diameter of about 0.010 to about 0.25 inches, or in some embodiments, about 0.050 inches In embodiments where the second channel 118 and the conductive member 120 are disposed radially inward of the first channel 110, such as shown in FIG. 4, the plurality of tabs (one tab 406 shown) may be disposed in an area away from the second channel 118. In such embodiments, each tab 406 of the plurality of tabs may have a width of about 0.02 to about 0.25 inches, or in some embodiments, about 0.05 inches, a length of about 0.02 to about 0.25 inches, or in some embodiments about 0.2 inches, and a thickness of about 0.005 to about 0.25 inches, or in some embodiments, about 0.020 inches.

Figure 5:
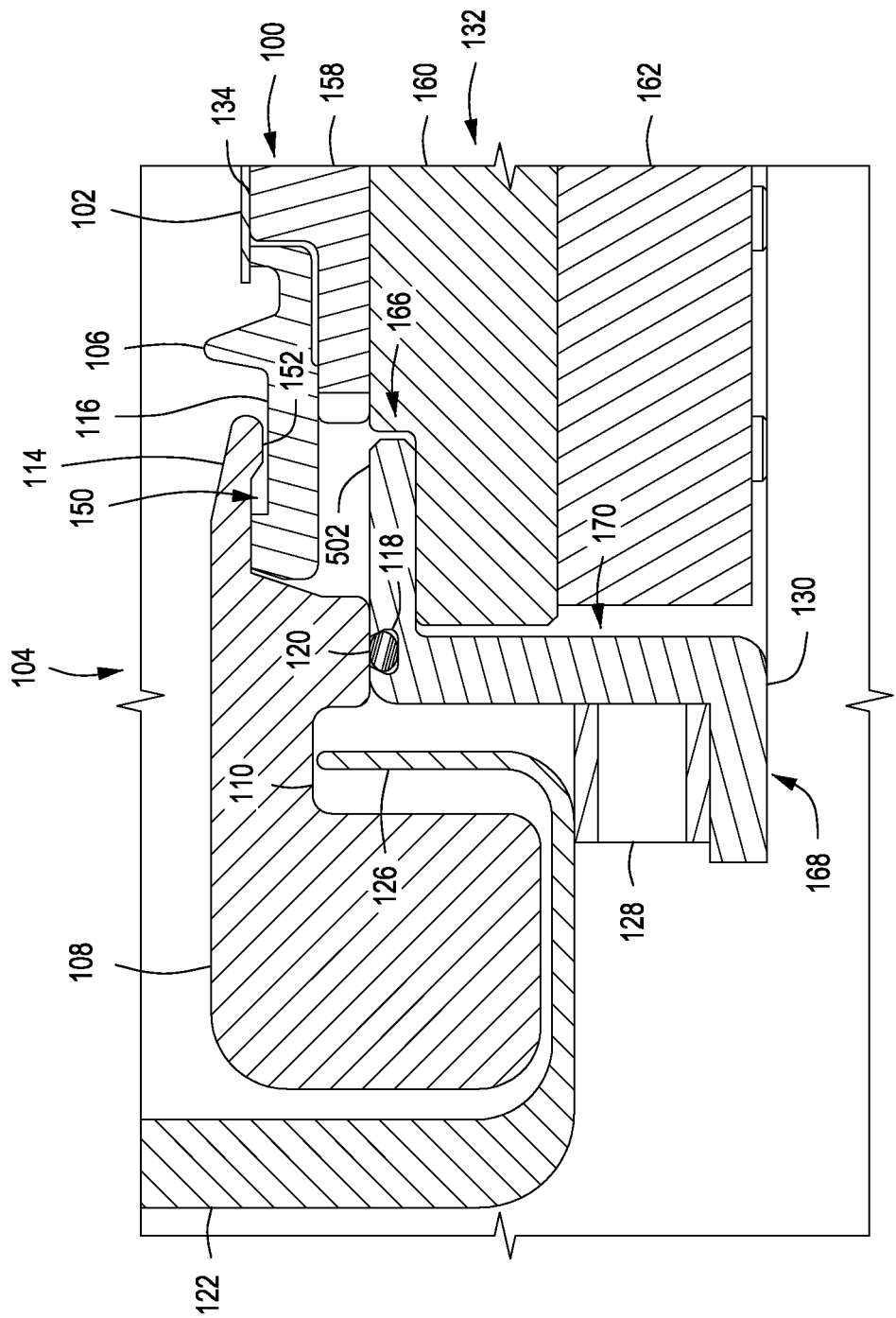
FIG. 5 depicts a portion of a process kit for a substrate process chamber in accordance with some embodiments of the present invention.

Although the conductive member 120 is shown in FIGS. 1-4 as positioned between the ring 108 and conductive shield 122, the conductive member 120 may be positioned between any of the conductive components of the process chamber to facilitate grounding the ring 108. For example, in some embodiments, the conductive member 120 may be positioned such that the conductive member 120 electrically couples the ring 108 to the housing 130, such as shown in FIG. 5. In such embodiments, the second channel 118 may be formed in a top surface 502 of the housing 130 and the conductive member 120 at least partially disposed in the second channel 118.

Although described above as a gasket, a tubular or solid ring, a canted coil, or the like in FIGS. 1-5, the conductive member 120 may be any type of process-compatible conductive component suitable to electrically couple the ring 108 and conductive shield 122 and/or housing 130. For example, in some embodiments, the conductive member 120 may be a grounding strap, for example such as the second grounding strap 602 shown in FIG. 6. In some embodiments, the second grounding strap 602 may electrically couple the ring 108 to the housing 130. In such embodiments, the ring 108 may be coupled to a ledge 604 extending radially outward from the center portion 170 of the housing 130.

By utilizing the second grounding strap 602, the ring 108 remains electrically coupled to the housing 130 (and, therefore, grounded via the electrical coupling of the conductive shield 122 to the housing 130) when lifted by the substrate support 100, thus allowing the ring 108 to be grounded regardless of the position of the ring 108. The second grounding strap 602 may be any type of grounding strap having any shape and material composition, for example such as the materials, shapes and types of grounding straps discussed above with respect to the first grounding strap 128.

Figure 6:
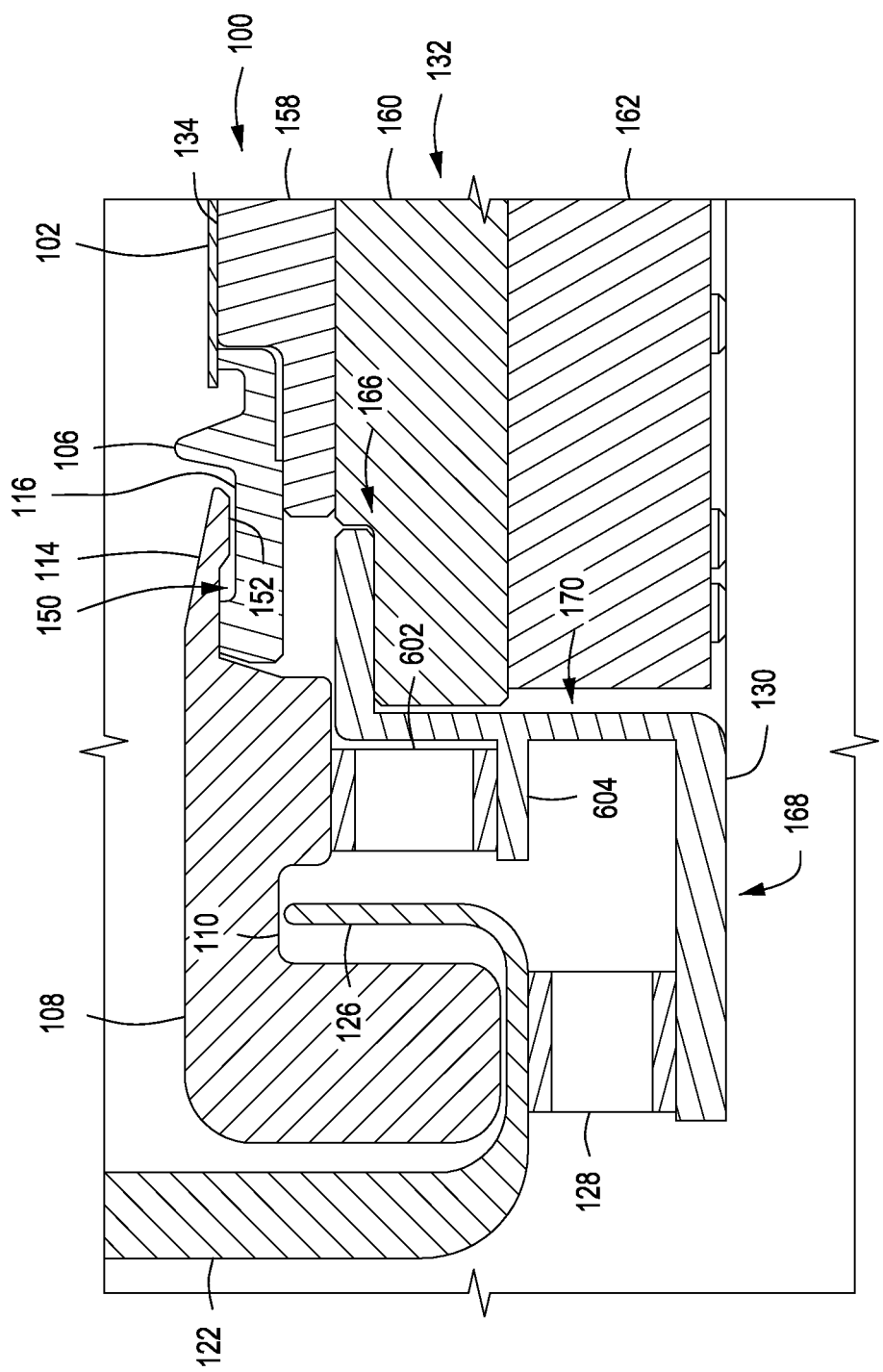
FIG. 6 depicts a portion of a process kit for a substrate process chamber in accordance with some embodiments of the present invention.
Figure 7:
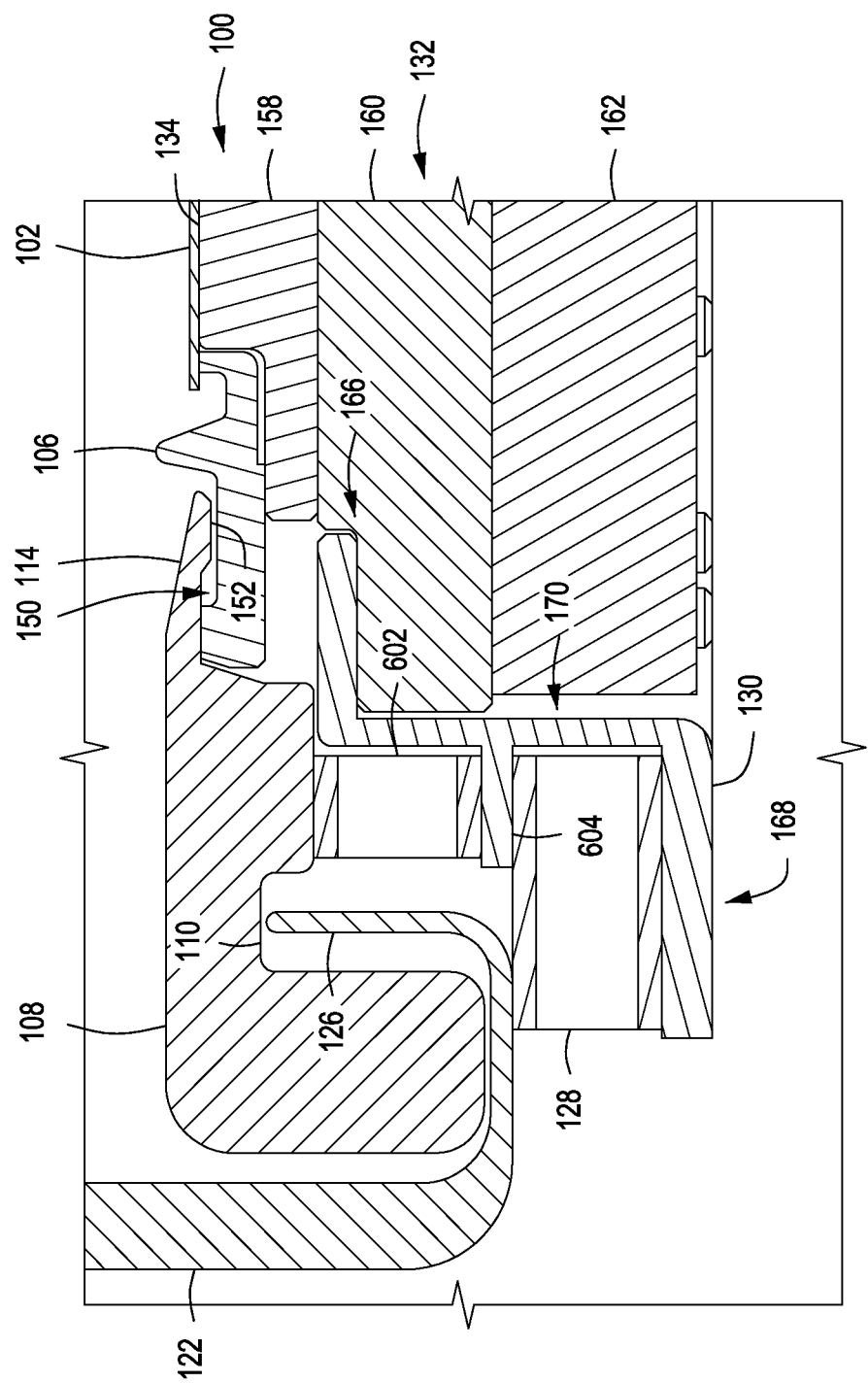
FIG. 7 depicts a portion of a process kit for a substrate process chamber in accordance with some embodiments of the present invention.

In some embodiments, the second grounding strap 602 may be disposed above the first grounding strap 128 such that at least a portion of the second grounding strap 602 overlaps with at least a portion of the first grounding strap 128, such as shown in FIG. 7. Alternatively, in some embodiments, the second grounding strap 602 may be offset from the first grounding strap 128, for example, such as shown in FIG. 6.

As illustrated in FIGS. 5-7, grounding of the ring 108 is achieved through electrically conductive contact with the housing 130. Primary contact between the ring 108 and the housing 130 is provided by the conductive member 120 (FIG. 5) and/or by grounding strap 602 (FIGS. 6 and 7).

Figure 8:
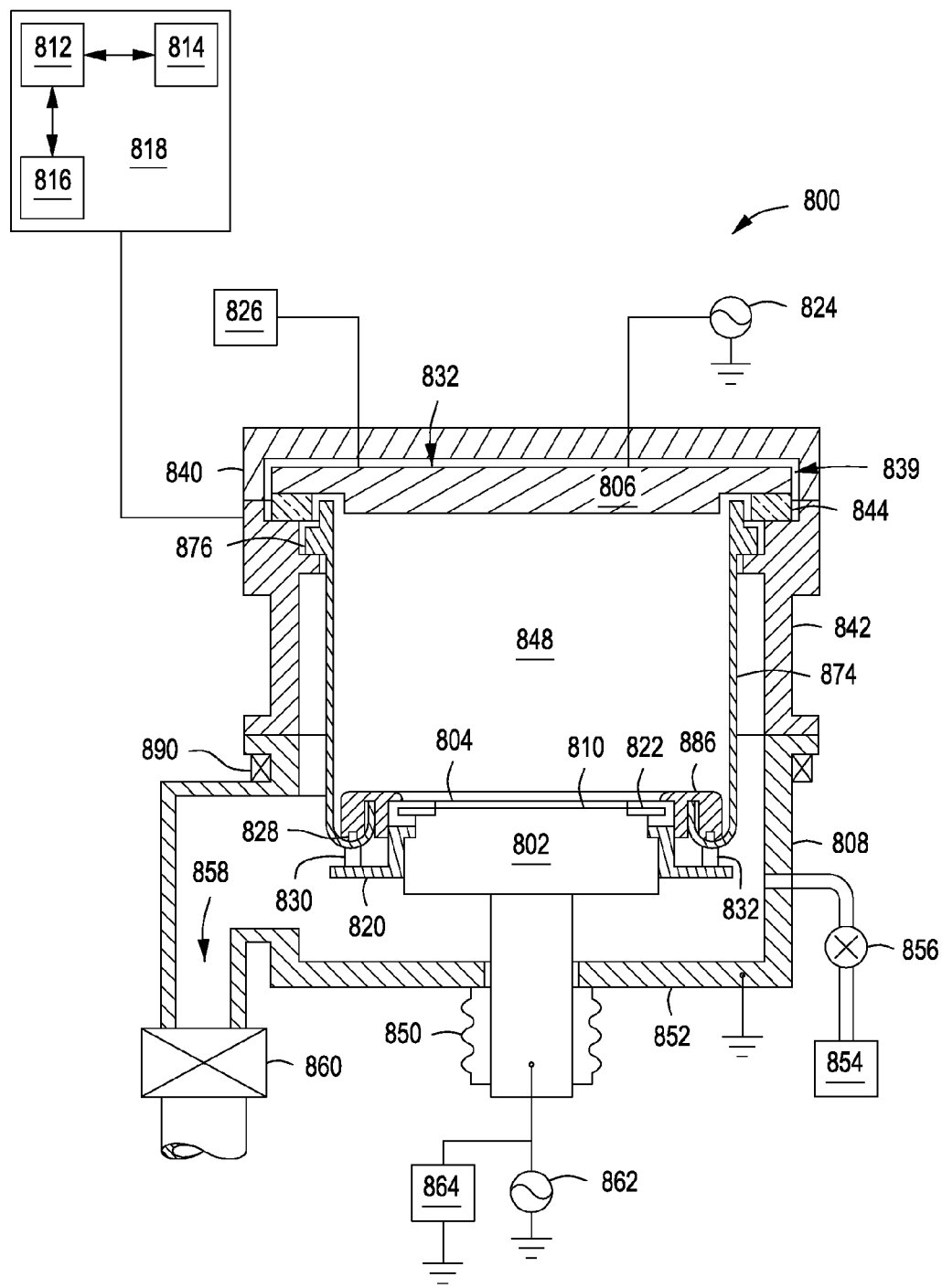
FIG. 8 depicts a process chamber suitable for use with a process kit in accordance with some embodiments of the present invention.

FIG. 8 depicts a schematic view of a process chamber suitable for use with the process kit described above in accordance with some embodiments of the present invention. Examples of suitable PVD chambers include the ALPS® Plus and SIP ENCORE® PVD process chambers, both commercially available from Applied Materials, Inc., of Santa Clara, Calif. Other process chambers from Applied Materials, Inc. or other manufactures may also benefit from the inventive method disclosed herein.

The process chamber 800 contains a substrate support pedestal 802 (e.g., the substrate support pedestal 100 described above) for receiving a substrate 804 (e.g., the substrate 102 described above) thereon, and a sputtering source, such as a target 806. The substrate support pedestal 802 may be located within a grounded enclosure wall 808, which may be a chamber wall (as shown) or a grounded shield (a ground shield 840 is shown covering at least some portions of the process chamber 800 above the target 806). In some embodiments, the ground shield 840 could be extended below the target to enclose the pedestal 802 as well.

The target 806 may be coupled to a source distribution plate (not shown). The source distribution plate may be fabricated from suitable conductive materials to conduct power from one or more power sources to the target 806. Any number of power sources may be utilized to provide power to the target 806 to accommodate for a particular application or process performed in the process chamber 800. For example, in some embodiments, a DC power source 826 and RF power source 824 may provide DC power and RF power, respectively, to the target 806 via the source distribution plate. In such embodiments, the DC power source 826 may be utilized to apply a negative voltage, or bias, to the target 806. In some embodiments, RF energy supplied by the RF power source 824 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (e.g., two or more) to provide RF energy in a plurality of the above frequencies.

The ground shield 840 may be provided to cover the outside surfaces of the lid of the process chamber 800. The ground shield 840 may be coupled to ground, for example, via the ground connection of the chamber body. The ground shield 840 may comprise any suitable conductive material, such as aluminum, copper, or the like. An insulative gap 839 is provided between the ground shield 840 and the outer surfaces of the distribution plate, and the target 806 to prevent the RF and DC energy from being routed directly to ground. The insulative gap may be filled with air or some other suitable dielectric material, such as a ceramic, a plastic, or the like.

The target 806 may be supported on a grounded conductive aluminum adapter 842 through a dielectric isolator 844. The target 806 comprises a material to be deposited on the substrate 804 during sputtering, such a metal or metal oxide. In some embodiments, a backing plate (not shown) may be coupled to the source distribution plate-facing surface 832 of the target 806. The backing plate may comprise a conductive material, such as copper-zinc, copper-chrome, or the same material as the target, such that RF and DC power can be coupled to the target 406 via the backing plate. Alternatively, the backing plate may be non-conductive and may include conductive elements (not shown) such as electrical feedthroughs or the like for coupling RF and DC power to the target 806.

The substrate support pedestal 802 has a substrate support surface 810 facing the principal surface of the target 806 and supports the substrate 804 to be processed. In some embodiments, a housing 820 (e.g., the housing 130 described above) may be disposed about at least a portion of the substrate support pedestal 802. The substrate support pedestal 802 may support the substrate 804 in a processing volume 848 of the process chamber 800. The processing volume 848 is defined as the region above the substrate support pedestal 802 during processing (for example, between the target 806 and the substrate support pedestal 802 when in a processing position).

In some embodiments, the substrate support pedestal 802 may be vertically movable through a bellows 850 connected to a bottom chamber wall 852 to allow the substrate 804 to be transferred onto the substrate support pedestal 802 through a load lock valve (not shown) in the lower portion of processing the process chamber 800 and thereafter raised to one or more positions for processing (e.g., as described above).

One or more processing gases may be supplied from a gas source 854 through a mass flow controller 856 into the lower part of the process chamber 800. An exhaust port 858 may be provided and coupled to a pump (not shown) via a valve 860 for exhausting the interior of the process chamber 800 and facilitating maintaining a desired pressure inside the process chamber 800.

In some embodiments, one or more power sources (an RF power source 862 and DC power source 864 shown) may be coupled to the substrate support 802. When present, the RF bias power source 862 may be coupled to the substrate support pedestal 802 to induce a negative DC bias on the substrate 804. In addition, in some embodiments, a negative DC self-bias may form on the substrate 804 during processing.

In some embodiments, the process chamber 800 may further include a shield 874 (e.g., the conductive shield 122 described above) connected to a ledge 876 of the adapter 842. The adapter 842 in turn is sealed and grounded to the aluminum chamber sidewall 808. Generally, the shield 874 extends downwardly along the walls of the adapter 842 and the chamber wall 808 downwardly to below an upper surface of the substrate support pedestal 802 and returns upwardly until reaching an upper surface of the substrate support pedestal 802, forming an inwardly extending ledge 828 (e.g., the inwardly extending ledge 154 described above). In some embodiments, one or more grounding straps 830, 832 (e.g., the grounding strap 128 described above) may electrically couple the shield 874 to the housing 820. In some embodiments, a ring 886 (e.g., the ring 108 described above) rests on the top of the inwardly extending ledge 828 of the shield 874. An additional deposition ring 822 (e.g., the deposition ring 106 described above) may be used to shield the periphery of the substrate 804 during processing.

In some embodiments, a magnet 890 may be disposed about the process chamber 800 for selectively providing a magnetic field between the substrate support pedestal 802 and the target 806. For example, as shown in FIG. 8, the magnet 890 may be disposed about the outside of the chamber wall 808 in a region just above the substrate support pedestal 802. In some embodiments, the magnet 890 may be disposed additionally or alternatively in other locations, such as adjacent the adapter 842. The magnet 890 may be an electromagnet and may be coupled to a power source (not shown) for controlling the magnitude of the magnetic field generated by the electromagnet.

A controller 818 may be provided and coupled to various components of the process chamber 800 to control the operation thereof. The controller 818 includes a central processing unit (CPU) 812, a memory 814, and support circuits 816. The controller 810 may control the process chamber 800 directly, or via computers (or controllers) associated with particular process chamber and/or support system components. The controller 818 may be one of any form of general-purpose computer processor that can be used in an industrial setting for controlling various chambers and sub-processors. The memory, or computer readable medium, 814 of the controller 818 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 816 are coupled to the CPU 812 for supporting the processor in a conventional manner. These circuits include cache, power supplies, clock circuits, input/output circuitry and subsystems, and the like. Inventive methods as described herein may be stored in the memory 814 as software routine that may be executed or invoked to control the operation of the process chamber 800 in the manner described herein. The software routine may also be stored and/or executed by a second CPU (not shown) that is remotely located from the hardware being controlled by the CPU 812.

Thus, embodiments of process kits for substrate process chambers are provided herein. In at least some embodiments, the inventive process kit may facilitate selective grounding of a process kit ring to accommodate for the requirements of a desired process. In addition, when grounded, the inventive process kit may provide a more robust electrical coupling of the process kit ring to conductive process chamber components as compared to utilizing conventionally utilized process kits.

While the foregoing is directed to embodiments of the present invention, other and further embodiments of the invention may be devised without departing from the basic scope thereof.

The invention claimed is:

1. A process kit for a substrate process chamber, comprising:
   a ring having a body and a lip extending radially inward from the body, wherein the body has a first channel formed in a bottom of the body;
   an annular conductive shield having a lower inwardly extending ledge that terminates in an upwardly extending portion configured to interface with the first channel of the ring; and
   an annular conductive member electrically coupling the ring to the conductive shield when the ring is disposed on the conductive shield.

2. The process kit of claim 1, further comprising a second channel formed in the bottom of the body, wherein the conductive member is at least partially disposed within the second channel, and wherein the conductive member is one of a tubular or solid ring, or a canted coil spring.

3. The process kit of claim 2, wherein the second channel is positioned radially outward from the first channel such that the conductive member contacts an inner surface of the lower inwardly extending ledge of the annular conductive shield.

4. The process kit of claim 2, wherein the lower inwardly extending ledge of the annular conductive shield comprises an inwardly extending radial lip coupled to an outer surface of the lower inwardly extending ledge, and wherein the second channel is positioned such that the conductive member contacts the inwardly extending radial lip.

5. The process kit of claim 2, wherein the second channel is disposed radially inward of the first channel such that the conductive member contacts a conductive housing of a substrate support disposed beneath the process kit, and wherein the conductive housing is electrically coupled to the annular conductive shield.

6. The process kit of claim 1, wherein the lower inwardly extending ledge of the annular conductive shield comprises a plurality of gas holes to allow a flow of gas through the annular conductive shield.

7. The process kit of claim 1, wherein the body comprises a plurality of tabs extending downward from the bottom of the body to contact the annular conductive shield when the ring is disposed on the conductive shield.

8. The process kit of claim 1, wherein the lip overlaps a portion of a deposition ring disposed beneath the process kit.

9. The process kit of claim 8, wherein the lip comprises an annular ring extending downward from the lip and configured to interface with a channel formed in the deposition ring to limit a flow of plasma or process gas between the deposition ring and the ring.

10. The process kit of claim 1, further comprising a first grounding strap electrically coupling the annular conductive shield to a conductive housing of a substrate support disposed beneath the process kit.

11. A process kit for a substrate process chamber, comprising:

a ring having a body and a lip extending radially inward from the body, wherein the body has a first channel formed in a bottom of the body;

an annular conductive shield having a lower inwardly extending ledge that terminates in an upwardly extending portion configured to interface with the first channel of the ring; and a conductive member electrically coupling the ring to the conductive shield when the ring is disposed on the conductive shield; and a first grounding strap electrically coupling the annular conductive shield to a conductive housing of a substrate support disposed beneath the process kit, wherein the conductive member is a second grounding strap electrically coupling the ring to the conductive housing of the substrate support to electrically couple the ring to the annular conductive shield.

12. A process chamber, comprising:

a substrate support disposed within an inner volume of the process chamber, the substrate support having a deposition ring disposed atop the substrate support and a conductive housing disposed about the substrate support;

a process kit disposed about a peripheral edge of the substrate support, wherein at least a portion of the process kit is disposed above a substrate supporting surface of the substrate support, and wherein the process kit comprises:

a ring having a body and a lip extending radially inward from the body, the lip partially overlapping a portion of the deposition ring, wherein the body has an annular first channel formed in a bottom of the body;

an annular conductive shield having a lower inwardly extending ledge that terminates in an upwardly extending portion configured to interface with the first channel of the ring; and a conductive member electrically coupling the ring to the conductive shield when the ring is disposed on the conductive shield; and a first grounding strap electrically coupling the annular conductive shield to the conductive housing of the substrate support.

13. The process chamber of claim 12, further comprising a second channel formed in the bottom of the body, wherein the conductive member is at least partially disposed within the second channel, and wherein the conductive member is one of a tubular or solid ring, or a canted coil spring.

14. The process chamber of claim 13, wherein the second channel is positioned radially outward from the first channel such that the conductive member contacts an inner surface of the lower inwardly extending ledge of the annular conductive shield.

15. The process chamber of claim 13, wherein the lower inwardly extending ledge of the annular conductive shield comprises an inwardly extending radial lip coupled to an outer surface of the lower inwardly extending ledge, and wherein the second channel is positioned such that the conductive member contacts the inwardly extending radial lip.

16. The process chamber of claim 13, wherein the second channel is disposed radially inward of the first channel such that the conductive member contacts the conductive housing of the substrate support, and wherein the conductive housing is electrically coupled to the annular conductive shield.

17. The process chamber of claim 12, wherein the lower inwardly extending ledge of the annular conductive shield comprises a plurality of gas holes to allow a flow of gas through the annular conductive shield.

18. The process chamber of claim 12, wherein the body comprises a plurality of tabs extending downward from the bottom of the body to contact the annular conductive shield when the ring is disposed on the conductive shield.

19. The process chamber of claim 12, wherein the conductive member is a second grounding strap electrically coupling the ring to the conductive housing of the substrate support to electrically couple the ring to the annular conductive shield.

* * * * *